United States Patent
Banin et al.

(10) Patent No.: US 10,151,049 B2
(45) Date of Patent: Dec. 11, 2018

(54) PATTERNS OF FLUORESCENT SEEDED NANORODS

(71) Applicant: Yissum Research Development Company of the Hebrew University of Jerusalem Ltd., Jerusalem (IL)

(72) Inventors: Uri Banin, Mevasseret Zion (IL); Shlomo Magdassi, Jerusalem (IL); Shai Shemesh, Karmiel (IL); Shira Halivni, D N North Yehuda (IL); Yelena Vinetsky, Jerusalem (IL)

(73) Assignee: Yissum Research Development Company of the Hebrew University of Jerusalem Ltd., Jerusalem (IL)

( * ) Notice: Subject to any disclaimer, the term of this patent is extended or adjusted under 35 U.S.C. 154(b) by 0 days.

(21) Appl. No.: 15/325,483

(22) PCT Filed: Jul. 14, 2015

(86) PCT No.: PCT/IL2015/050727
§ 371 (c)(1),
(2) Date: Jan. 11, 2017

(87) PCT Pub. No.: WO2016/009431
PCT Pub. Date: Jan. 21, 2016

(65) Prior Publication Data
US 2017/0175293 A1    Jun. 22, 2017

Related U.S. Application Data

(60) Provisional application No. 62/024,569, filed on Jul. 15, 2014.

(51) Int. Cl.
*B32B 3/00* (2006.01)
*C30B 29/50* (2006.01)
(Continued)

(52) U.S. Cl.
CPC .......... *C30B 29/50* (2013.01); *B41J 2/04581* (2013.01); *B82Y 30/00* (2013.01); *B82Y 40/00* (2013.01);
(Continued)

(58) Field of Classification Search
CPC .......... C09B 29/50; C09B 29/62; C30B 7/14; C09D 11/037; C09D 11/50; C09D 11/322;
(Continued)

(56) References Cited

U.S. PATENT DOCUMENTS 9,109,163 B2 * 8/2015 Arbell .................... C09K 11/02
9,868,901 B2 * 1/2018 Arbell .................. C09K 11/883

FOREIGN PATENT DOCUMENTS

CN     1845806 A    10/2006
EP   1 661 648 A1    5/2006
(Continued)

OTHER PUBLICATIONS

Anikeeva et al., "Quantum Dot Light-Emitting Devices with Electroluminescence Tunable over the Entire Visible Spectrum", Nano Letters, vol. 9, No. 7, pp. 2532-2536, (2009).
(Continued)

*Primary Examiner* — Elizabeth E Mulvaney
(74) *Attorney, Agent, or Firm* — Vorys, Sater, Seymour & Pease LLP

(57) ABSTRACT

Provided are printed patterns and objects including, for example, a film or 3D object, which may include one or more nanorods. According to the subject matter provided, the nanorods may reduce or diminish inter-particle interaction in the pattern or object.

16 Claims, 6 Drawing Sheets

(51) Int. Cl.
  B82Y 30/00      (2011.01)
  B82Y 40/00      (2011.01)
  B41J 2/045      (2006.01)
  C09D 11/037     (2014.01)
  C09D 11/322     (2014.01)
  C09D 11/50      (2014.01)
  C09K 11/88      (2006.01)
  C30B 7/14       (2006.01)
  C30B 29/62      (2006.01)

(52) U.S. Cl.
  CPC .......... *C09D 11/037* (2013.01); *C09D 11/322* (2013.01); *C09D 11/50* (2013.01); *C09K 11/883* (2013.01); *C30B 7/14* (2013.01); *C30B 29/62* (2013.01); *Y10S 977/762* (2013.01); *Y10S 977/774* (2013.01); *Y10S 977/824* (2013.01); *Y10S 977/892* (2013.01); *Y10S 977/95* (2013.01)

(58) Field of Classification Search
  CPC ............... Y10S 977/95; Y10S 977/762; Y10S 977/774; Y10S 977/824; Y10S 977/892; B82Y 30/00; B82Y 40/00; C09K 11/883
  See application file for complete search history.

(56) References Cited

FOREIGN PATENT DOCUMENTS

| WO | 2012/035535 A1 | 3/2012 |
| WO | 2012/174533 A2 | 12/2012 |
| WO | 2013/188927 A1 | 12/2013 |

OTHER PUBLICATIONS

Arango et al., "Heterojunction Photovoltaics Using Printed Colloidal Quantum Dots as a Photosensitive Layer", Nano Letters, vol. 9, No. 2, pp. 860-863, (2009).

Binetti et al., "Nanocomposites based on highly luminescent nanocrystals and semiconducting conjugated polymer for inkjet printing", Nanotechnology, vol. 23, 075701, 10 pages, (2012).

Broussard et al., "Fluorescence resonance energy transfer microscopy as demonstrated by measuring the activation of the serine/threonine kinase Akt", Nature Protocols, vol. 8, No. 2, pp. 265-281, (2013).

Carbone, et al., "Synthesis and Micrometer-Scale Assembly of Colloidal CdSe/CdS Nanorods Prepared by a Seeded Growth Approach", Nano Letters, vol. 7, No. 10, pp. 2942-2950, (2007).

Christdoulou et al., "Synthesis of highly luminescent wurtzite CdSe/CdS giant-shell nanocrystals using a fast continuous injection route", J. Mater. Chem. C, vol. 2, pp. 3439-3447, (2014).

Dorokhin et al., "Fabrication and Luminescence of Designer Surface Patterns with BETA-Cyclodextrin Functionalized Quatum Dots via Multivalent Supramolecular Coupling", ACS Nano, vol. 4, No. 1, pp. 137-142, (2010).

Elliott et al., "Inkjet Printing of Quantum Dots in Photopolymer for Use in Additive Manufacturing of Nanocomposites", Advanced Engineering Materials, vol. 15, No. 10, pp. 903-907, (2013).

Grouchko et al., "Formation of air-stable copper-silver core-shell nanoparticles for inkjet printing", J. Mater. Chem., vol. 19, pp. 3057-3062, (2009).

Haverinen et al., "Inkjet printing of light emitting quantum dots", Applied Physics Letters, vol. 94, 073108, 3 pages, (2009).

Haverinen et al., "Inkjet Printed RGB Quantum Dot-Hybrid LED", Journal of Display Technology, vol. 6, No. 3, pp. 87-89, (2010).

Ingrosso et al., "Drop-on-demand inkjet printing of highly luminescent CdS and CdSe@ZnS nanocrystal based nanocomposites", Microelectronic Engineering, vol. 86, pp. 1124-1126, (2009).

Kamyshny et al., "Ink-Jet Printing of Metallic Nanoparticles and Microemulsions", Macromol. Rapid Commun., vol. 26, pp. 281-288, (2005).

Kim et al., "Contact Printing of Quantum Dot Light-Emitting Devices", Nano Letters, vol. 8, No. 12, pp. 4513-4517, (2008).

Kim et al., "Inkjet-Printed Multicolor Arrays of Highly Luminescent Nanocrystal-Based Nanocomposites", Small, vol. 5, Vo. 9, pp. 1051-1057, (2009).

Kim et al., "Full-colour quantum dot displays fabricated by transfer printing", Nature Photonics, vol. 5, pp. 176-182, (2011).

Kim et al., "Performance of light-emitting diode based on quantum dots", Nanoscale, vol. 5, pp. 5205-5214, (2013).

Kress et al., "Near-Field Light Design with Colloidal Quantum Dots for Photonics and Plasmonics", Nano Lett., vol. 14, pp. 5287-5233, (2014.

Marjanovic et al., "Inkjet printing and low temperature sintering of CuO and CdS as functional electronic layers and Schottky diodes", J. Mater. Chem., vol. 21, 13634, 6 pages, (2011).

Niittynen et al., "Comparison of laser and intense pulsed light sintering (IPL) for inkjet-printed copper nanoparticle layers", Scientific Reports, vol. 5, 8832, 10 pages, (2015).

Panzer et al., "Nanoscale Morphology Revealed at the Interface Between Colloidal Quantum Dots and Organic Semiconductor Films", Nano Lett, vol. 10, pp. 2421-2426, (2010).

Park et al., "Direct writing of copper conductive patterns by ink-jet printing", Thin Solid Films, vol. 515, pp. 7706-7711, (2007).

Rizzo et al., "Hybrid Light-Emitting Diodes from Microcontact-Printing Double-Transfer of Colloidal Semiconductor CdSe/ZnS Quantum Dots onto Organic Layers", Adv. Mater., vol. 20, pp. 1886-1891, (2008).

Rizzo et al., "White Electroluminescence from a Microcontact-Printing-Deposited CdSe/ZnS Colloidal Quantum-Dot Monolayer", Small, vol. 4, No. 12, pp. 2143-2147, (2008).

Rizzo et al., "Polarized Light Emitting Diode by Long-Range Nanorod Self-Assembling on a Water Surface", ACS Nano, vol. 3, No. 6, pp. 1506-1512, (2009).

Sitt et al., "Highly Emissive Nano Rod-in-Rod Heterostructures with Strong Linear Polarization", Nano Lett., vol. 11, pp. 2054-2060, (2011).

Small et al., "Inkjet Printing of Water 'Soluble' Doped ZnS Quantum Dots", Eur. J. Inorg. Chem., pp. 242-247, (2010).

Tekin et al., "Inkjet Printing of Luminescent CdTe Nanocrystal-Polymer Composites", Adv. Funct. Mater., vol. 17, pp. 23-28, (2007).

Wood et al., "Inkjet-Printed Quantum Dot-Polymer Composites for Full-Color AC-Driven Displays", Adv. Mater., vol. 21, pp. 2151-2155, (2009).

Zhou et al., "Fabrication of Three-Dimensional Surface Structures with Highly Fluorescent Quantum Dots by Surface-Templated Layer-by-Layer Assembly", Adv. Mater., vol. 17, pp. 1243-1248, (2005).

* cited by examiner

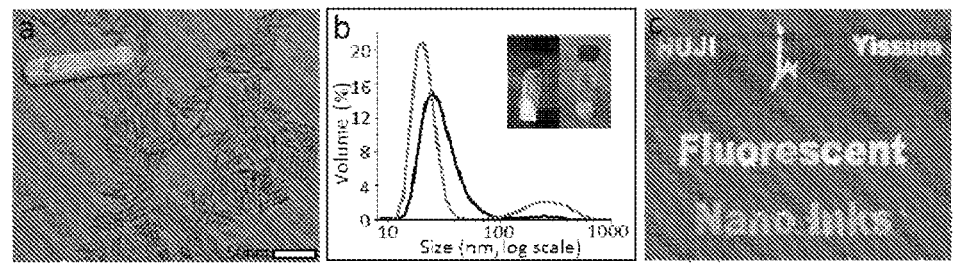
Figs. 1A-C
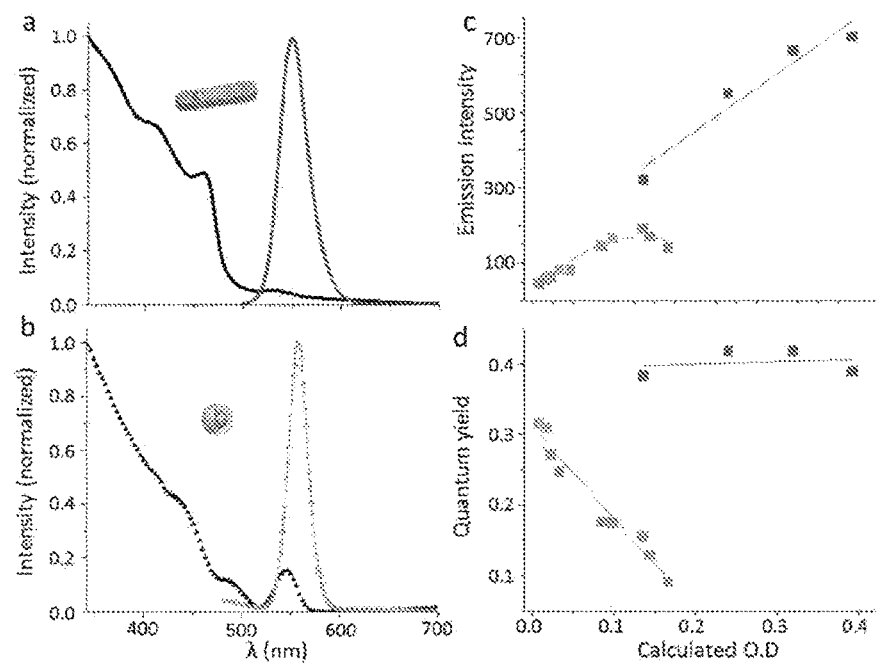
Figs. 2A-D

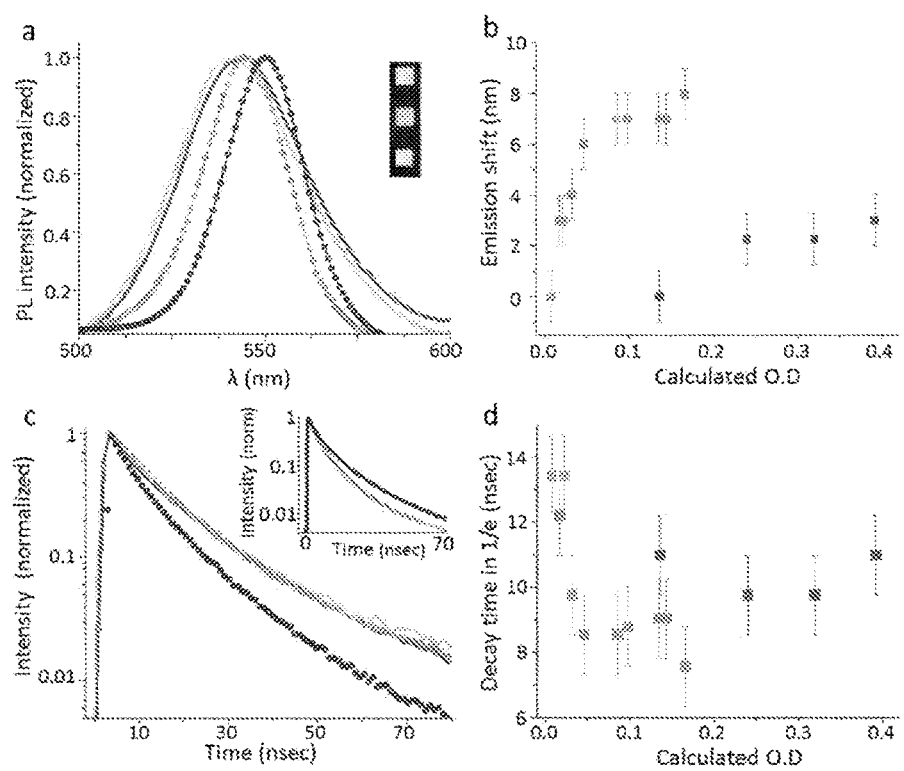
Figs. 3A-D

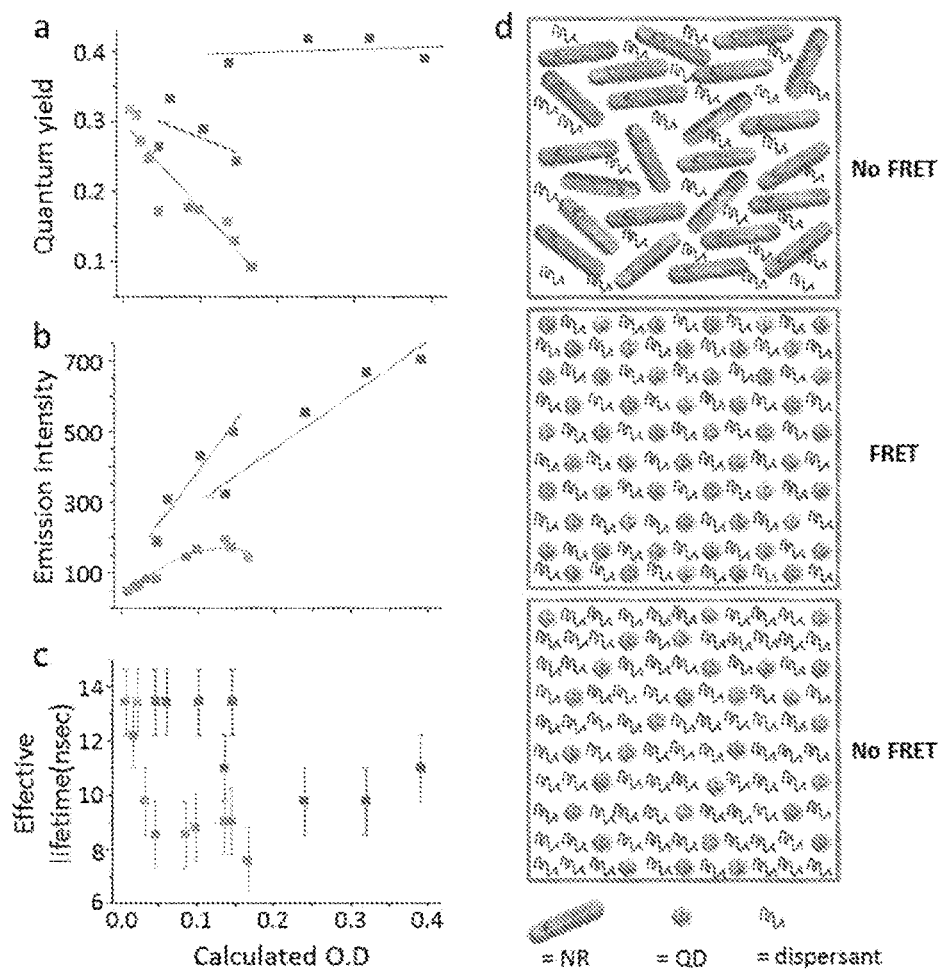
Figs. 4A-D

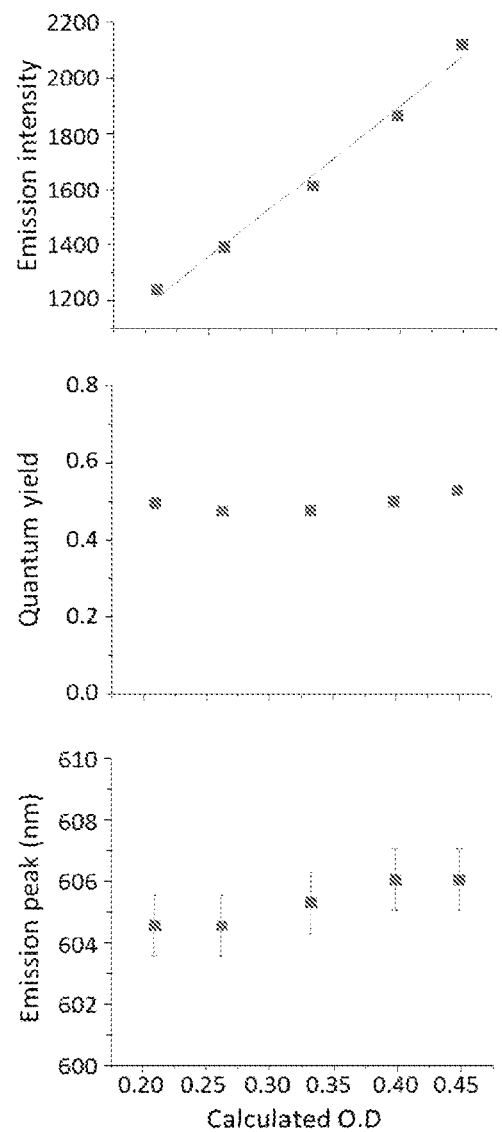
Figs. 7A-C

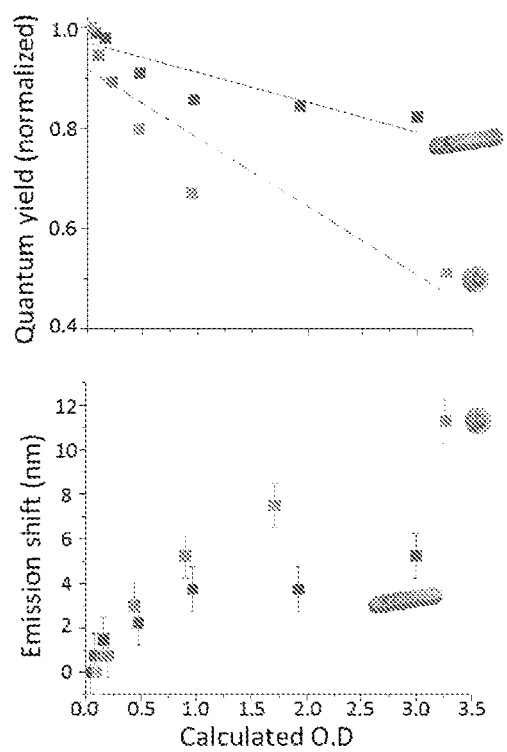
Figs. 8A-B
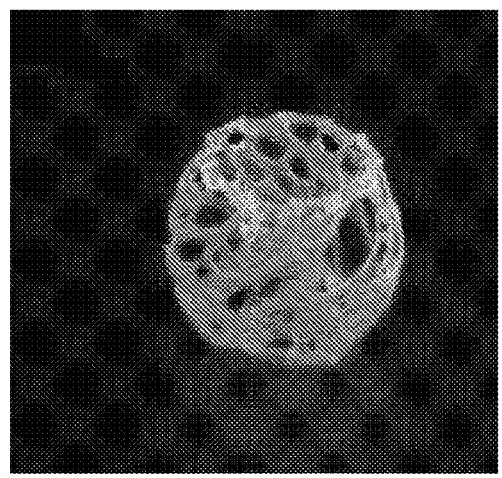
Fig. 9

US 10,151,049 B2

PATTERNS OF FLUORESCENT SEEDED NANORODS

TECHNOLOGICAL FIELD

The invention generally relates to processes for constructing patterns of seeded nanorods.

BACKGROUND ART

In the last few years, fluorescent semiconductor nanocrystals (NCs) have developed greatly in terms of control of their size, shape and composition, providing exceptional control over their properties, allowing for their implementation in a variety of applications such as displays.

The NCs are characterized by a wide absorption spectrum accompanied by a narrow and sharp emission spectrum at the band edge, which enable the simultaneous excitation of NCs with different emission wavelengths using the same lighting source. The fluorescent semiconductor NCs also show outstanding optical and chemical stability under light irradiation over long periods of time. In addition, they are easily adapted to specific applications by the ability to design and control the emission color and properties by tuning their size, shape and composition. Their surface chemistry can be adjusted for dispersion in a specific medium, both in organic and polar media, by proper selection of the stabilizing moieties.

One approach used to achieve applicable devices is layer deposition by different printing techniques [1-9], in particular, semiconductor NCs have been recently introduced successfully into flat panel displays, serving as color converters and emitting entities providing liquid crystal displays with exceptional high color gamut and brightness [10].

Inkjet printing is an important wet deposition method for nanoparticles (NPs), which is commonly used in industrial and domestic applications. Previous reports discuss the printing of NPs [11-14]. Inkjet printing of fluorescent semiconductor NCs quantum dots (QDs) was also achieved [15-24].

Although there are many advantages for the use of fluorescent semiconductor QDs for printing applications, their arrangement in proximity on a substrate leads to optical interference due to particle-particle interactions. These interactions may result in Forster resonance energy transfer (FRET) as well as in self-absorption effects. The phenomenon of self-absorption, in which particles absorb the light emitted by other particles, is highly pronounced in QDs, even after a growth of an outer shell on the emission center. This phenomenon is caused by the significant overlap between the absorption and the emission spectra of the QDs, which leads to efficient re-absorption of the emission. The self-absorption effect causes the effective external emission quantum yield (QY) to decrease significantly and induces changes in the fluorescent color by shifting the emission energy to longer wavelengths. A similar degradation in emission properties is also induced by the FRET process by which an excited QD serves as a donor to transfer this excitation through non-radiative dipole-dipole interactions to neighboring QD serving as an acceptor. While the re-absorption effect becomes significant especially in cases of high optical density samples, the FRET interaction takes place in instances in which particles are in close proximity as is often required in thin fluorescent layers.

REFERENCES

[1] S. Kim, S H. Im, S. W. Kim, *Nanoscale* 2013, 5, 5205.
[2] D. Dorokhin, S. H. Hsu, N. Tomczak, D. N. Reinhoudt, J. Huskens, A. H. Velders, J. Vancso, *ACS Nano* 2010, 4, 137.
[3] A. C. Arango, D. C. Oertel, Y. Xu, M. G. Bawendi, V. Bulović, *Nano Lett.* 2009, 9, 860.
[4] M. J. Panzer, K. E. Aidala, P. O. Anikeeva, J. E. Halpert, M. G. Bawendi, V. Bulović, *Nano Lett.* 2010, 10, 2421.
[5] L. A Kim, P. O. Anikeeva, S. A. Coe-Sullivan, J. S. Steckel, M. G. Bawendi, V. Bulović, *Nano Lett.* 2008, 8, 4513.
[6] P. O. Anikeeva, J. E. Halpert, M. G. Bawendi, V. Bulovic, *Nano Lett.* 2009, 9, 2532.
[7] D. Zhou, A. Bruckbauer, C. Abell, D. Klenerman, D. J. Kang, *Adv. Mater.* 2005, 17, 1243.
[8] S. J. P. Kress, P. Richner, S. V. Jayanti, P. Galliker, D. K. Kim, D. Poulikakos, D. J. Norris, *Nano Lett.* 2014, 14, 5827.
[9] A. Rizzo, M. Mazzeo, M. Palumbo, G. Lerario, S. D'Amone, R. Cingolani, G. Gigli, *Adv. Mater.* 2008, 20, 1886.
[10] T. H. Kim, K. S. Cho, E. K. Lee, S. J. Lee, J. Chae, J. W Kim, D. H Kim, J. Y Kwon, G. Amaratunga, S. Y Lee, B. L Choi, Y. Kuk, J. M Kim, K. Kim, *Nature Photonics* 2011, 5, 176.
[11] M. Grouchko, A. Kamyshny, S. Magdassi, *J. Mater. Chem.* 2009, 19, 3057.
[12] A. Kamyshny, M. Ben-Moshe, S. Aviezer, S. Magdassi, Macromolecular *Rapid Communications* 2005, 26, 281.
[13] B. K. Park, D. Kim, S. Jeong, J. Moon, J. S. Kim, *Thin Solid Films* 2007, 515, 7706.
[14] J. Niittynen, E. Sowade, H. Kang, R. R. Baumann, M. Mantysalo, *Scientific Reports* 2015, 5, 8832.
[15] E. Tekin, P. J. Smith, S. Hoeppener, A. M. J. van den Berg, A. S. Susha, A. L. Rogach, J. Feldmann, U. S. Schubert, *Advanced Functional Materials* 2007, 17, 23.
[16] V. Wood, M. J. Panzer, J. Chen, M. S. Bradley, J. E. Halpert, M. G. Bawendi, V. Bulović, *Adv. Mater.* 2009, 21, 2151.
[17] H. M. Haverinen, R. A. Myllylä, G. E. Jabbour, *Appl. Phys. Lett.* 2009, 94, 073108.
[18] H. M. Haverinen, R. A. Myllylä, G. E. Jabbour, *J. Disp. Technol.* 2010, 6, 87.
[19] J. Y. Kim, C. Ingrosso, V. Fakhfouri, M. Striccoli, A. Agostiano, M. L. Curri, J. Brugger, *Small* 2009, 5, 1051.
[20] A. M. Elliott, O. S. Ivanova, C. B. Williams, T. A. Campbell, *Advanced Engineering Materials* 2013, 15, 903.
[21] E. Binetti, C. Ingrosso, M. Striccoli, P. Cosma, A. Agostiano, K. Pataky, J. Brugger, M. L. Curri, *Nanotechnology* 2012, 23, 075701.
[22] C. Ingrosso, J. Y. Kim, E. Binetti, V. Fakhfouri, M. Striccoli, A. Agostiano, M. L. Curri, J. Brugger, *Microelectronic Engineering* 2009, 86, 1124.
[23] N. Marjanovic, J. Hammerschmidt, J. Perelaer, S. Farnsworth, I. Rawson, M. Kus, E. Yenel, S. Tilki, U. S. Schubert, R. R. Baumann, *J. Mater. Chem.* 2011, 21, 13634.
[24] A. C. Small, J. H. Johnston, N. Clark, *Eur. J. Inorg. Chem.* 2010, 242.

SUMMARY OF THE INVENTION

The inventors of the technology disclosed herein have found that the effects associated with quantum dots (QDs), and which have been summarized in the background, present a limitation for the use of QDs in printing applications, in which maintaining high efficiency of fluorescence along with the control of optical properties is crucial. As this issue was found to be highly relevant while using spherical QDs, for example in displays, it became apparent that QD were no longer the immediate candidate for patterning, but rather a different system that would present high efficiency of fluorescence along with control of optical properties was necessary.

The inventors have realized a novel system that would not only enable efficient construction of structures (patterned, layered, arranged, closed packed and/or printed), but which also in a close-packed film has one or more of the following characteristics:

1. Stable quantum efficiency: The quantum efficiency of the pattern remains stable and substantially unchanged compared with a solution of same particles over one or more of: high density layer, multilayers, high optical density structures.

2. Stable optical features: The spectra features of the pattern, such as, emission wavelength, absorbance features, full width half maximum (FWHM) of the spectra features (peaks) remain stable under said abovementioned deposition conditions (from clause 1). The spectra features, e.g., the position of the emission peak wavelength remains stable and substantially unshifted compared with solution of same nanoparticles over one or more of: high density layer, multilayers, high optical density structures.

3. Reduced inter-particle interaction: Particle-particle interaction of highly proximate nanoparticles in the pattern remains substantially suppressed or does not exist. The suppressed inter-particle interaction may be Forster resonance energy transfer (FRET).

4. Reduced self-absorption: The pattern has substantially reduced or diminished undesired absorption of light emitted by the pattern itself (re-absorption).

Thus, it is a purpose of the invention to provide, in one of its aspects, a printed pattern composed of multiple material layers, each of said layers comprising a plurality of nanorods, the nanorods being selected to have substantially reduced overlap between the nanorods' absorption spectra and the nanorods' emission spectra, and wherein the plurality of nanorods are configured to exhibit in the pattern a reduced or diminished inter-particle interaction, wherein the printed pattern is selected from a film and a 3D object.

In some embodiments, the printed pattern is a patterned film. In some embodiments, the pattern is a 3-dimenstional object.

The pattern may be composed of multiple material layers, each of said layers being composed of a plurality of nanorods, the nanorods being selected to have substantially reduced overlap between the nanorods absorption spectra and the nanorods emission spectra, and wherein the plurality of nanorods are configured to adapt in the pattern an inter-particle distance which may be controlled, if so desired, namely it is controllable, to achieve reduced or diminished inter-particle interaction.

The invention further provides a printed pattern, which may be in the form of a patterned film, composed of multiple material layers, each of said layers being composed of a plurality of nanorods, the nanorods being selected to have substantially reduced overlap between the nanorods absorption spectra and the nanorods emission spectra, and wherein the plurality of nanorods are configured to adapt in the pattern a seed-to-seed distance larger than the FRET distance (which is calculated or known to be associated with the particular system or nanorods material), to affect a reduced or diminished inter-particle interaction.

As above, the pattern may be a film or a 3D object.

In some embodiments, a pattern of the invention is composed of any number of layers, each layer containing a plurality of seeded nanorods, the seeded nanorods being selected to have substantially reduced overlap between the nanorods absorption spectra and the nanorods emission spectra, and wherein the plurality of seeded nanorods are configured to a reduced or diminished re-absorption.

As noted, the seeded nanorods are selected to exhibit substantially reduced overlap between the nanorods absorption spectra and emission spectra. The reduction in the "spectral overlap between the absorption spectra and the emission spectra" refers to the integral between the (normalized) emission spectrum and absorbance spectrum of the nanoparticles. In other words, the nanorods are selected to have reduced or diminished shared regions of absorption and emission in their measured spectra. In some embodiments the spectral overlap (or the amount (number of photons) of absorbance at the same wavelengths (energy) of emission is less than 40% of the total amount of emission. In some embodiments, the spectral overlap is less than 30%, or less than 35%, or less than 25%, or less than 20%, or less than 15%, or less than 10%, or less than 5%, or less than 3%, or less than 1% of the total amount of emission. In some embodiments, there is no spectral overlap, i.e., the emission is at a different wavelength(s) than the absorbance.

The expression "reduced or diminished interaction" refers to elimination of any specific interaction, which may result from inter-particle interaction. In other words, in some embodiments, the interaction between any two neighboring particles is reduced in comparison, e.g., to an interaction known for the comparative QD systems or is completely diminished. In some embodiments, the interaction is reduced by at least 30%, 35%, 40%, 45%, 50%, 55%, 60%, 65%, 70%, 75%, 80%, 85%, 90%, 95%, 96%, 97%, 98%, 99% or 100% of an interaction known for the comparative QD systems.

The seeded nanorods so selected are typically elongated nanoparticles (nanorods) embedding a seed element of a different material composition. In a population of nanoparticles composed within any one or more layers of the printed pattern, other nanoparticles may also be present. In other words, the population of the nanoparticles must contain a plurality of seeded nanorods, as defined, and may further contain any amount of nanorods or other nanoparticles which do not embed therein a seed element.

Where the seed element is present within a nanorod, the seed may be selected from an elongated element, a spherical element, a core/shell element and a core/multishell element.

In some embodiments, the seed is a non-core/shell structure selected from an elongated element and a spherical element, the element being of a material composition different than the material composition of the nanorod embedding the seed.

In some embodiments, the seed is a core/shell or a core/multishell element, wherein the core and/or any one of the shells may independently have a spherical or an elongated shape.

In some embodiments, the seed is a core/shell structure that is selected from spherical core/spherical shell, spherical core/spherical shell/spherical shell, spherical core/elongated shell, spherical core/spherical shell/elongated shell, spherical core/elongated shell/elongated shell, elongated core/elongated shell and elongated core/elongated shell/elongated shell.

The seed structure or element may be concentrically or non-concentrically positioned in the nanorod. In other words, the seed may be considered to be "concentrically"

positioned with respect of the nanorod structure when the geometrical center of the seed and the rod embedding the seed are substantially coaxially aligned. When the centers are not so aligned, the seed is said to be non-concentric with respect of the nanorod embedding it, namely their geometrical centers do not coaxially align.

The size of the longest axis of the seeded nanorods, namely the size of the nanoparticle, may be above 5 nm. In some embodiments, the size of the longest axis is above 10 nm, or above 15 nm, or above 20 nm, or above 25 nm, or above 30 nm, or above 40 nm, or above 50 nm, or at least 70 nm or at least 100 nm.

The seed element is of a size smaller than the size of the longest axis of the nanorods embedding it. In some embodiments, the size ratio seed:nanorod embedding it is between 1:2.1 and 1:3, between 1:3 and 1:6, between 1:6 and 1:10. In other embodiments, the size ratio is 1:6, 1:7, 1:8, 1:9 or 1:10, wherein the size may be volume or length of the longest axis. In some embodiments, the ratio is between the seed diameter and the nanorods length; the ratio being selected as above.

In some embodiments, the seed has a size of less than 3 nm. In some embodiments, the seed size is less than 5 nm, less than 10 nm, less than 20 nm, depending on the size of the nanorods embedding the seed.

In other embodiments, the seed is of a size of between 1 and 50 nm. In other embodiments, the size is between 1 and 40 nm, 1 and 30 nm, 1 and 25 nm, 1 and 20 nm, 1 and 10 nm, 1 and 5 nm, 1 and 4 nm, or 1 and 3 nm.

The nanorod and/or seed material may be selected amongst semiconducting, metal oxide and insulator materials.

In some embodiments, the nanorod material and/or the seed material is or comprises a semiconductor material. In some embodiments, the nanorods material and the seed material is a semiconductor material.

In some embodiments, the material is a semiconductor material selected from elements of Group I-VII, Group II-VI, Group III-V, Group IV-VI, Group III-VI, and Group IV semiconductors and combinations thereof.

In other embodiments, the semiconductor material is a Group I-VII semiconductor material selected from CuCl, CuBr, CuI, AgCl, AgBr, AgI and the like.

In other embodiments, the semiconductor material is a Group II-VI material selected from CdSe, CdS, CdTe, ZnSe, ZnS, ZnTe, HgS, HgSe, HgTe, CdZnSe, ZnO and any combination thereof.

In further embodiments, Group III-V material are selected from InAs, InP, InN, GaN, InSb, InAsP, InGaAs, GaAs, GaP, GaSb, AlP, AlN, AlAs, AlSb, CdSeTe, ZnCdSe and any combination thereof.

In additional embodiments, the semiconductor material is selected from Group IV-VI materials, such as PbSe, PbTe, PbS, PbSnTe, $Tl_2SnTe_5$ and any combination thereof.

In other embodiments, the material is or comprises an element of Group IV. In some embodiments, the material is selected from C, Si, Ge, Sn and Pb.

In some embodiments, the material is metal, metal alloy or metal oxide. Non-limiting examples include ZnO, CdO, $Fe_2O_3$, $Fe_3O_4$, and $In_2O_3$.

In other embodiments, the material is selected amongst metal alloys and intermetallics of the above metal and/or transition metals.

In some embodiments, the seed material is different from the nanorods material. In some embodiments, the seed is of a material selected from InAs, InP, CdSe, ZnTe, ZnSe and ZnSeTe. In other embodiments, the nanorod material is selected from CdSe, CdS, CdSSe, CdZnSe, CdZnS, ZnS, ZnSe and ZnTe.

In some embodiments, the material of the nanorod is selected from CdS, CdZnS, ZnS, ZnTe and ZnTe/ZnS In some embodiments, the seeded nanorods is of a material selected from InAs/CdSe/CdS, InP/ZnTe/ZnS, InP/ZnSe/ZnTe, InP/ZnSe/CdS, InP/ZnSe/ZnS, ZnTe/ZnSe/ZnS, ZnSe/ZnTe/ZnS, ZnSeTe/ZnTe/ZnS, CdSe/CdSSe/CdS, CdSe/CdS/CdZnS, CdSe/CdZnSe/CdZnS and CdSe/CdZnS/ZnS.

In some embodiments, the seeded nanorod is selected from InAs/CdSe/ZnSe/CdS, and InP/ZnSe/ZnTe/ZnS.

Notwithstanding the above, in some embodiments, the seed material or the nanorods material may be a semiconductor material and the other of the seed material or the nanorods material may be a metal. In other embodiments, the seed material or the nanorods material may be a semiconductor material and the other of the seed material or the nanorods material may be another semiconductor material.

In further embodiments, each of the seed material and the nanorods material is a semiconductor material, provided that the two materials are not the same.

In a pattern according to the present invention, the seeded nanorods may be aligned. The seeded nanorods in a pattern may alternatively exhibit a variety of arrangements so long as the pattern is uninterrupted or is continuous at a particular surface region. The seeded nanorods may be arranged on a surface region as a film comprising one or more layers; in some embodiments, the film or pattern comprises multiple material layers, namely two or more material layers which are stacked on to of one another, each composed of the same or different seeded nanorods.

The film or pattern may be a 1D-pattern, in the form of, e.g., lines (straight line, curved line, close loop line, circles, etc). The film or the pattern may alternatively be a 2D-pattern, or a 3D-pattern. The pattern may be a continuous pattern or separated into several spaced-apart patterns, each may be the same or different (in terms of one or more of structure, size, composition and number of layers).

In any one layer or region of a pattern, the plurality of nanorods may be of any desired arrangement, such as randomly arranged nanorods within a layer, e.g., randomly intersecting nanoparticles, a network of nanorods, etc.

In a multilayered stacked arrangement, the pattern may comprise any number of layers. In some embodiments, the number of layers in the multilayer is less than 50. In other embodiments, the number of layers is between 2 and 10, is 2 or 3 or 4 or 5 or 6 or 7 or 8 or 9 or 10 layers. In still further embodiments, the number of layers is 2 or 3 or 4 or 5 layers.

In some embodiments, the printed pattern is a 3D object in which the seeded nanorods are embedded within the 3D structure.

As stated herein, the plurality of seeded nanorods making up each film of multiple layers is configured to adapt, in the film, a distance controllable to a reduced or diminished inter-particle interaction. In other words, the distance between the nanorods is pre-determined so that the interaction between the nanorods is minimized In fact, unlike in the case of QDs, where the nanoparticles need to be separated by at least one dispersant in order to achieve reduction in particle-particle interaction, the inter-particle interaction in nanorods employed in accordance with the invention is greatly reduced even if the nanorods are brought into close-proximity in the absence of such dispersants.

Therefore, the nanorods employed herein may be arranged in close proximity to each other while substantially reducing inter-particle interaction. In some embodiments, the film is engineered or configured such that the nanorods adapt a seed-to-seed distance which is larger than the FRET distance. This seed-to seed distance may be achieved even where the nanorods are in close proximity or even in contact with each other. As a person versed in the art would recognize, a calculated FRET distance is a value that can be extracted by known formula—see below, and is typically on the range of 3-10 nanometers, on average.

To calculate the Förster distance ($R_0$) the following equation can be used $$R_0^6 = \frac{9000(\ln 10)\kappa^2 Q_D}{128\pi^5 N_A n^4} \int_0^\infty F_D(\lambda)\varepsilon_A(\lambda)\lambda^4 d\lambda$$

where $\kappa^2$ is the orientation factor (typically for random donor-acceptor orientations $\kappa^2=2/3$.), n is the solvent or medium refractive index, the integral represents the overlap integral between the donor (rod) absorption spectrum, $F_D(\lambda)$, and the acceptor (rod) emission spectrum, $\varepsilon_A(\lambda)$, where $\lambda$ is the wavelength, $N_A$ is Avogadro's number, and $Q_D$ is the donor (rod) emission quantum yield.

Thus, in a pattern of the invention, FRET may be avoided by excluding buffer dispersant molecules (which are characteristic of patterns of QDs) that physically separate between the nanoparticles in the pattern, while utilizing the architecture of the nanorods instead. This permits close-packing of the nanorods and increased luminescence, in comparison to other nanoparticle systems, e.g., QDs. However, for certain applications, dispersants may be required for other and different purposes.

The placing of the nanorods in close proximity still yields only relatively small particle-particle interaction, which may be FRET, exciton diffusion or electron hopping. In some embodiments, the particle-particle interaction is FRET.

Depending on the size of the nanorods, as detailed hereinabove, the distance between the seed elements may be approximated or determined, given the approximate position of the seed within the rod. Based on this, the distance between two neighboring nanorods is sufficient to determine the effective seed-to-seed distance or more generally the distance at which inter-particle interaction is reduced or diminished. In some embodiments, the distance between any two neighboring nanorods may be less than 100 nm. In some embodiments, the distance is less than 50 nm, less than 40 nm, less than 30 nm, less than 20 nm, less than 10 nm, less than 5 nm, less than 4 nm, less than 3 nm, less than 2 nm, or less than 1 nm.

In some embodiments, the distance between any two neighboring nanorods may be more than 1 nm. In some embodiments, the distance is more than 2 nm, more than 3 nm, more than 4 nm, more than 5 nm, more than 8 nm, more than 10 nm, more than 15 nm, or more than 20 nm.

In some embodiments, any two neighboring nanorods or at least a portion of the plurality of the nanorods are in direct contact with one another.

The pattern of the invention may be formed on a substrate of different materials, shapes and configurations. The pattern may cover the full surface of a substrate. In other embodiments, the pattern may be a continuous pattern on said substrate or a plurality of spaced apart patterns on said substrate.

As used herein, the "substrate" may be of a flexible or rigid material, which may be substantially two-dimensional (a thin flat substrate) or a three-dimensional curved (non-flat) surface. The substrate may be of any smoothness. In most general terms, the substrate may be of a solid material such as glass, paper, a semiconductor inorganic or organic material, a polymeric material or a ceramic surface. The substrate may also be paper. The material from which a surface region of the substrate is formed may or may not be the same as the material of the substrate itself. A pattern may be formed on the full surface of the substrate or on any one or more regions thereof.

In some embodiments, the substrate is flexible. In some embodiments, the substrate is conductive. In some embodiments, the substrate is transparent.

In some embodiments, the substrate is made of a polymeric material such as polyethylene, polypropylene, polyvinylchloride (PVC),polycarbonate, polyethylene terphtahale (PET), polyethylene naphthalate (PEN), polymethyl methacrylate (PMMA) silicon rubber, cellulose, and synthetic paper such as Teslin (TESLIN® substrate is composed of a very high molecular weight polyolefin phase and a filler phase, which is primarily silica). In some embodiments, the substrate is a ceramic substrate, a metal or a glass.

The patterning of a film on a substrate region may be achieved by any printing method configured to providing continues printing modality. Such printing method is ink-jet printing.

In additional aspects of the invention, the seeded nanorods may be utilized in the construction of 3-dimensional objects or patterns, wherein the nanorods are embedded or mixed in a formulation comprising at least one polymerizable material. Upon printing or otherwise application of the polymerizable material comprising the seeded nanorods, the printed or formed/applied object or pattern may be polymerized, by any method known in the art. In some embodiments, the 3D printing method is stereo-lithography (SLA) or inkjet printing in which the polymerization occurs upon exposure to light. In some embodiments, the formulation comprising the polymerizable material may further comprise at least one initiator.

The initiator may be selected amongst photoinitiators. The photoinitiator may be a free-radical polymerization initiator, which can be activated by actinic radiation. In some embodiments, initiation is achievable by a UV-light source. In some embodiments, the initiator is selected from organic peroxides, azo compounds, quinines, nitro compounds, acyl halides, hydrazones, mercapto compounds, pyrylium compounds, imidazoles, chlorotriazines, benzoin, benzoin alkyl ethers, benzoin ethers, benzil ketals, alpha-dialkoxyacetophenones, alpha-hydroxyalkylphenones, acylphosphine oxides, benzophenones, thioxanthones and titanocenes.

In some embodiments, the formulation comprising the polymerizable material and the seeded rods and optionally the at least one initiator may be a liquid formulation or a formulation which is in a liquid form at the application temperature.

The polymerizable material may be selected amongst such polymer-forming materials; such as monomers, oligomers, prepolymers, short polymers and a combination thereof. The resulting polymers may be selected amongst a variety of polymers.

Examples of polymers that can be formed include, in a non-limiting fashion, polyacrylates, polyurethanes, polyphthalamides, polyesters, polysulfonamides, polyvinyls, polyaryls, and aromatic and non-aromatic polyamides and any combinations thereof as mixtures, copolymers, block co-polymers and others.

Thus, in another aspect, the invention provides a pattern or an object formed by ink-jet printing of a plurality of seeded nanorods as detailed herein.

More particularly, the invention provides a process for forming a pattern of a plurality of seeded nanorods, the process comprising ink-jetting a formulation/dispersion of the seeded nanorods onto a surface region; wherein the nanorods are selected to have substantially reduced overlap between the nanorods absorption spectra and the nanorods emission spectra, the ink-jetting being configured to form a pattern of the nanorods, the pattern composed of a number (which is controllable) of printed layers (1 or more, or 2 or more, as defined herein) and exhibiting at least one of reduced or diminished re-absorption and reduced or diminished inter-particle interaction.

As the above process may be repeated to form a stacked multi-layer, the invention further provides a process for patterning a multi-layer structure, each layer of said multi-layer comprising a plurality of seeded nanorods, the process comprising:

forming a pattern of seeded nanorods on a surface region by ink-jetting plurality of droplets of a formulation/dispersion of the seeded nanorods onto the surface region;

forming by ink-jet printing a further layer of the nanorods on a previously formed pattern; and optionally repeating the printing to form the multi-layer (the previous and any subsequent pattern need not be of the same contour, shape, size and chemical composition as the previous or any later-printed layer or pattern);

wherein the nanorods are selected to have substantially reduced overlap between the nanorods absorption spectra and the nanorods emission spectra, the ink-jetting being configured to form a pattern of the nanorods, the pattern exhibiting at least one of reduced or diminished re-absorption and reduced or diminished inter-particle interaction.

In another aspect, the invention provides a patterned film or a 3D obtained by a process of the invention.

In some embodiments, the process of the invention comprises one or more pre-printing (pre-treatment) steps, and optionally one or more post-printing (post-treatment) steps. The pre-treatment and post-treatment may be independently selected from drying, heating, chemical treatment, plasma, photonic irradiation, UV, laser, microwave irradiation, NIR lamp, flash lamp (Xenon), further coating and other treatments.

In some embodiments, the pre-treatment and/or post-treatment step comprises drying of a printed pattern at specific temperature range, according to the ink and substrates properties. Where the process comprises two or more layering steps to afford a stacked multilayer, each layer may be dried or partially dried prior to formation of the subsequent layer thereon.

For the purpose of printing, the nanorods may be formulated into an ink formulation at a concentration configured to permit, in the patterned film, a desired inter-particle distance (the distance permitting a reduced or diminished re-absorption).

A 3D object of a polymerizable material may be formed as indicated herein, e.g., by forming a multilayer object which comprises the polymerizable material, the seeded nanorods and optionally the initiator. Polymerization of the polymerizable material in a printed or 3D-formed object may be after each layer has been formed, after a plurality of layers have been formed or as a final stage in the fabrication of the object. As with any other pattern of the invention, the 3D object may be first formed on a substrate and thereafter may be disconnected or detached therefrom.

Thus, in one aspect, the invention provides a printing formulation (i.e., ink formulation) comprising plurality of seeded nanorods, as defined herein, suspended or dispersed in a medium. The medium may be an aqueous or non-aqueous (organic) liquid medium. In some embodiments, the medium is water or a water-containing liquid mixture. In further embodiments, the medium is a water-containing liquid mixture, also containing an organic solvent. In other embodiments, the medium may be an organic solvent or a medium containing an organic solvent. In some embodiments, the organic solvent is selected from alcohols, glycols, glycol ethers, acetates, ethers, ketones, amides and hydrocarbons.

In some embodiments, the medium is selected from dipropyleneglycol methyl ether (DPM), 2-methoxyethyl ether (diglyme), triethyleneglycol dimethyl ether (triglyme), propylene glycol, sulfolane, polyethylene glycol and glycerol.

In some embodiments, the organic solvent is selected amongst glycol ethers. In some embodiments, the glycol ether is selected from Dowanol™ DB, Dowanol™ PM glycol ether, Dowanol™ DPM, Dowanol™ DPM glycol ether, Dowanol™ DPMA glycol ether, Dowanol™ TPM glycol ether, Dowanol™ TPM-H GE, Dowanol™ PMA, Dowanol™ DPMA, Dowanol™ PnP glycol ether, Dowanol™ DPnP glycol ether, Dowanol™ PnB glycol ether, Dowanol™ DPnB glycol ether, Dowanol™ TPnB glycol ether, Dowanol™ PPh glycol ether, Dowanol™ PGDA, Dowanol™ DMM, Dowanol™ EPh glycol ether, and any other glycol ether. In the above list, Dowanol™ are DOW Chemical Co. hydrophobic/hydrophilic glycol ethers.

In some embodiments, the organic solvent is di(propylene glycol)methyl ether acetate (DPMA) or propylene glycol methyl ether acetate (PMA) or their combinations.

In some embodiments, the organic solvent is a mixture of solvents. In some embodiments, the organic solvent is a mixture of di(propylene glycol)methyl ether acetate (DPMA) and propylene glycol methyl ether acetate (PMA). In some embodiments, the organic solvent is a mixture of solvents comprising two solvents in different ratios, e.g., the two solvents may be at a ratio of 50:50 or 60:40 or 70:30 or 80:20 or 90:10 or 95:10.

In other embodiments, the solvent is an alcohol selected from methanol, ethanol, propanol, butanol and other alcohols. In further embodiments, the solvent may be an acetate such as ethyl acetate, ethylaceto acetate, and others.

In other embodiments, the solvent is selected from acetone, ethyl acetate, ethanol, propanol, butanol, and any combination thereof.

The solvent selection is performed according to the required physicochemical properties of the ink for the specific printing technology, addressing parameters such as surface tension, viscosity, evaporation rate, contact angle on specific substrates.

The nanoparticles in the ink formulation may be stabilized by one or more stabilizers (dispersing agents, dispersants) to prevent aggregation and/or agglomeration of the particles and to enable a stable dispersion. Such materials may be selected from surfactant materials and/or polymers. The stabilizer may have ionic or non-ionic functional groups, or a block co-polymer containing both.

In some embodiments, the stabilizing agent is a dispersing agent.

In some embodiments, the formulation is free of a dispersing agent.

In some embodiments, the dispersing agent may be selected amongst surfactants, polyelectrolytes and polymeric materials. Representative examples of such dispersants include without limitation polycarboxylic acids, alkyl amine salts of polycarboxylic acids, polyacrylate dispersants, polyethyleneimine dispersants and polycations, in general, polyvinylpyrrolidone and its derivatives, ethoxylated alkyl amine and PEG/PPG amines (hydrophilic polyether monoamine)

In further embodiments, the dispersant is a surfactant, which may or may not be ionic. In some embodiments, the surfactant is cationic or anionic. In further embodiments, said surfactant is non-ionic or zwitterionic. Non-limiting examples of such cationic surfactants include didodecyldimethylammonium bromide (DDAB), CTAB, CTAC, cetyl (hydroxyethyl)(dimethyl)ammonium bromide, N,N-dimethyl-N-cetyl-N-(2-hydroxyethyl)ammonium chloride, anionic surfactants such as sodium dodecyl sulfate (SDS) and various unsaturated long-chain carboxylates, zwitterionic phospholipids, such as 1,2-bis(10,12-tricosadiynoyl)-sn-glycero-3-phosphochline, water-soluble phosphine surfactants, such as sodium salts of sulfonated triphenylphosphine, $P(m-C_6H_4SO_3Na)_3$ and alkyltriphenylmethyltrisulfonate, $RC(p-C_6H_4SO_3Na)_3$, alkyl polyglycol ethers, e.g., ethoxylation products of lauryl, tridecyl, oleyl, and stearyl alcohols; alkyl phenol polyglycol ethers, e.g., ethoxylation products of octyl- or nonylphenol, diisopropyl phenol, triisopropyl phenol; alkali metal or ammonium salts of alkyl, aryl or alkylaryl sulfonates, sulfates, phosphates, and the like, including sodium lauryl sulfate, sodium octylphenol glycolether sulfate, sodium dodecylbenzene sulfonate, sodium lauryldiglycol sulfate, and ammonium tri-tert-butyl phenol and penta- and octa-glycol sulfonates; sulfosuccinate salts, e.g., disodium ethoxylated nonylphenol ester of sulfosuccinic acid, disodium n-octyldecyl sulfosuccinate, sodium dioctyl sulfosuccinate, and the like.

In some embodiments, the surfactant is Surfonamine L-100.

The ink formulation may further comprise an additive selected from humectants, binders, surfactants, fungicides, rheology modifiers, pH adjusting agents, wetting agents and mixtures thereof. The water based ink formulation may further comprise humectants.

The concentrations of all components should enable proper printing and proper properties of the printed patterns, such as good adhesion to the substrate and isolation from moisture.

As indicated herein, the patterned films according to the invention exhibit higher optical and chemical stability and thus may be used in a variety of applications. Such applications may in particular include fluorescent signage, optoelectronic applications and devices. Due to the special advantages of the patterned films, devices based on such films exhibit high performance operation.

Thus, in a further aspect, the invention provides a novel film structure having plurality of nanorods, as defined, for use in a device.

The present invention further provides a device implementing at least one patterned film according to the present invention. In some embodiments, the layer implemented in a device is manufactured according to a process of the invention.

In the above embodiments, the substrate on which the film is provided may be an integral part of a device or may be a substrate which following its treatment as recited is implemented in a device.

The device may be an optoelectronic or optical device.

The patterned film of the invention and the device comprising it may be utilized in a variety of optical applications, such in communication, fluorescence, lighting, displays, marking, biomedicine, sensors, signage devices, absorbing or lasing materials, etc.

The optoelectronics or optical devices may be such that source, detect and control light; they may be electrical-to-optical and/or optical-to-electrical transducers. Non-limiting examples of applications and devices comprising a patterned film of the invention include a light conversion layer for a display or as fluorescent signage, or a light emitting diode.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 1A—TEM image of seeded nanorods used as color pigment for the ink formulation. Inset shows a cartoon of the seeded rods architecture.

FIG. 1B—Dynamic light scattering measurements of the green emitting seeded nanorods in toluene and in ink formulation. Inset: the green emitting seeded nanorods ink formulation under UV light and ambient light.

FIG. 1C—Green (31 nm/4.2 nm) and red (25 nm/5.2 nm) emitting CdSe/CdS seeded nanorods printed on thick glass exposed to blue LED illumination.

FIG. 2A—absorption and emission spectra of CdSe/CdS seeded NRs used for green light emitting ink.

FIG. 2B—Absorption and emission spectra of CdSe/CdS core/shell QDs used for ink formulation.

FIG. 2C—Emission intensity of green emitting seeded NRs with dimensions of 31 nm/4.2 nm and green emitting QDs with diameter of 4 nm printed arrays at different optical densities at 450 nm. All samples were excited at 450 nm. Calculated optical densities were determined analytically using the Hamamatsu instrument.

FIG. 2D—Quantum yield values of the same printed NRs and QDs measured using absolute QY measurement system and excited at 450 nm.

FIG. 3A—Emission spectra of printed NRs with O.D=0.14, and O.D=0.41 versus printed QDs with O.D=0.017 and O.D=0.17. All O.D values are at the excitation wavelength of 450 nm. Inset: Printed squares of green emitting NRs at different optical densities under UV light. The printed arrays show no significant difference in the emission color with increased number of layers of printed material.

FIG. 3B—Emission shift of printed NRs and QDs at different optical densities. For the printed NRs the emission wavelength remain stable with the increase in number of layers of printed material, while there is a significant wavelength red shift for the printed QDs at higher optical densities.

FIG. 3C—Lifetime measurements of printed NRs with O.D=0.14 and O.D=0.41 versus printed QDs with O.D=0.017, and O.D=0.17. Inset: lifetime measurements of QDs ink solutions with O.D=0.032, and O.D=1.64. As the optical density of the QD ink increases, the lifetime is elongated, which indicates the self-absorption effect within the QD solutions.

FIG. 3D—Effective lifetime values taken at the emission intensity reaching 1/e for printed NRs and QDs at different optical densities. Upon the increase in number of layers of printed material, the effective lifetime of the NRs remains constant, while for the QDs a shortening in the lifetimes is observed with the addition of printed material, which indicates the occurrence of a FRET process between the proximal spherical nanoparticles on the substrate.

FIG. 4A—Quantum yield of printed QDs containing 1% wt and 4.5% wt of dispersant molecules.

FIG. 4B—Emission intensity of the same samples of ink with 1% wt and 4.5% wt of dispersant.

FIG. 4C—Effective lifetime taken at the decay at 1/e of printed ink with 1% wt dispersant in comparison with 4.5% wt dispersant. As the number of the dispersant molecules increases, the distance between the particles elongates and the FRET process is less pronounced. The QY remains stable for the samples containing a higher percentage of dispersant, and a significant increase in the emission intensity is also observed for these samples, with increased thickness. The lifetime curves of the printed arrays containing higher quantity of dispersant show no significant change with the addition of printed material, which indicates that no significant FRET is occurring between the nanoparticles, due to the relatively longer distance caused by the addition of dispersant molecules. Results for printed NRs in 4a-c are shown again for comparison.

FIG. 4D—A cartoon demonstrating the printed arrays of NRs, QDs with 1% wt dispersant, and QDs with 4.5% wt dispersant (top to bottom). For the NRs and for the QDs with higher percentage of dispersant, no FRET is observed due to relatively large distance between the emission centers of the NPs, while for the printed samples containing QDs with 1% wt of dispersant a significant FRET effect is present due to the close proximity of the QDs.

FIG. 7A—Emission intensity of red emitting NRs (25 nm/5.2 nm) at different optical densities. The fluorescence intensity increases with the addition of printed material.

FIG. 7B—Quantum yield values at different optical densities of the same red emitting NRs. The quantum yield remains stable upon the addition of printed material.

FIG. 7C—Emission wavelength peak values of the same printed red NRs, which is stable even at thicker NR layers.

FIG. 8A—Normalized quantum yield values of green emitting NRs solutions and green emitting QDs solutions at different optical densities. As the solution's concentration increases, the quantum yield of the QDs solutions decreases more significantly than for the solutions containing NRs.

FIG. 8B—Emission shift of the same solutions containing NRs and QDs. The emission shift is significantly higher for the solutions containing QDs than the solutions containing NRs. These optical behaviors are caused by the self-absorption effect that is highly pronounced for the QDs in comparison with the NRs.

FIG. 9—a 3D object fabricated by stereo-lithography (SLA). The object material comprising a plurality of seeded nanorods according to the invention.

DETAILED DESCRIPTION OF EMBODIMENTS

Figure 5:
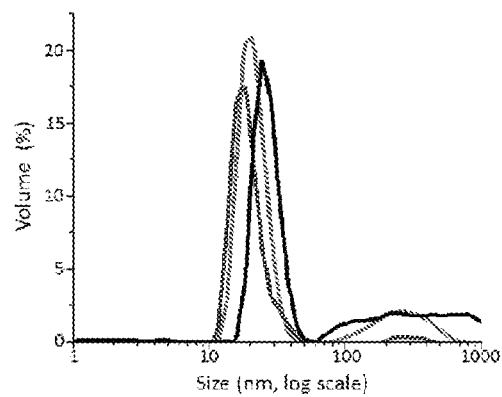
FIG. 5—Three runs of DLS measurements of green emitting NRs ink. Each run includes 16 individual measurements for more accurate results. The average size of the particle is 21 nm, which correlates to the measurements of the same NRs in toluene solution.

Semiconductor nanocrystals exhibit unique fluorescent properties which are tunable by size, shape and composition. The high quantum yield and enhanced stability led to their use in biomedical imaging and flat panel displays. Here, semiconductor nanorods based inkjet inks are presented, overcoming limitations of the commonly reported quantum dots in printing applications. Fluorescent seeded nanorods were found to be outstanding candidates for fluorescent inks, due to their low particle-particle interactions and negligible self-absorption. This is manifested by insignificant emission shifts upon printing, even at highly concentrated printed layers and by maintaining the high fluorescence quantum yield, unlike quantum dots which exhibit fluorescent wavelengths shifts and quenching effects. This behavior results from the reduced absorption/emission overlap, accompanied by low energy transfer efficiencies between the nanorods as supported by steady state and time resolved fluorescence measurements. The new seeded nanorods inks enable patterning of thin fluorescent layers, for demanding light emission applications such as signage and displays.

Here, the inventors present a new and efficient solution to the above problem by printing inks containing seeded semiconductor nanorods (NRs) as the fluorescent active colorant. For these NRs the spectral overlap of the absorption and the emission spectra is reduced significantly due to the large volume of the rod compared to the emitting seed. Furthermore, the special seeded rods geometry inherently reduces significantly the detrimental effects of FRET interactions with neighboring NRs. As discussed hereinbelow, the use of fluorescent NRs for inkjet printing application therefore offers significant advantages over the spherical QDs.

Herein, the inventors demonstrate the inkjet printing of seeded NRs inks. For this purpose, an exemplary system comprising CdSe/CdS seeded NRs was used as a tunable pigment, covering green to red emitting inks. The NRs are adjusted for dispersion in organic based solutions, while proven suitable for printing on a variety of substrates. The inventors have revealed the advantages of using seeded NRs for inkjet printing by conducting a thorough comparison of the optical properties of the NRs and QDs in this context. Both steady state and time-resolved fluorescence measurements were performed to investigate these effects. The results of the investigation show improved performances in printing of fluorescent seeded nanorods that is of relevance for a variety of applications.

Inkjet Printing of Fluorescent NRs Inks.

Emitting CdSe seeded CdS NRs (CdSe/CdS NRs) as the fluorescent pigment were dispersed in solvents to form the ink formulations. The CdSe/CdS NRs used as fluorescent pigments were prepared using a previously reported method.[31] Briefly, in a first stage, synthesis of CdSe seeds was conducted by the reaction of Cadmium and Selenium precursors, and in the second stage the seeds were injected along with Sulfur to a hot flask containing Cadmium Oxide and stabilizing ligands, thus enabling the growth of the CdS rod. For more details on the synthesis see the experimental section below. FIG. 1A shows a TEM image of green emitting seeded NRs (31×4.2 nm) used herein. The emission color of the NRs is tuned across the visible range by changing in particular the dimensions of the seed NCs, and further tuning the diameter of the rods. The CdSe/CdS seeded NRs used herein are highly emissive with a QY ranging from 40 to 90%, while dispersed in toluene.

For the solvent based ink formulations we used the NRs with alkyl-phosphonic acid and alkyl-phosphine ligands attached to the NCs surface during the synthesis stage. The NRs were dispersed in 90% di propylene glycol methyl ether acetate (DPMA) and 10% propylene glycol methyl ether acetate (PMA), while using a dispersion agent, as described in the experimental section. In order to achieve high quality printing, various properties of the formulation such as the viscosity, evaporation rate, substrates wetting, and surface tension. Typical parameters of the inks were as follow: Viscosity of 2.0 cPs, and surface tension of 28.4 dyne/cm. Proper evaporation was achieved by using two solvents with high and low evaporation rate at a 1:9 ratio as described in the experimental section. The high quality of dispersion of the NRs and the maintenance of their high QY are both important aspects for the integration of the NRs within ink formulations. The particle size distribution of the NRs in the ink formulation was characterized using dynamic light scattering (DLS) analysis, as can be seen in FIG. 1B. While the DLS method analysis is designated for spherical particle model, it still provides a qualitative measure for comparative analysis even for the NRs. With this in mind, it is observed that the average size (FIG. 1B), of the green emitting NRs in the ink formulation with a value of 21 nm correlates to the average size of the NRs in toluene with a value of 25 nm, which indicates the high quality dispersion of the NRs in the ink formulation. These results also show a similarity to the average NRs length obtained by TEM analysis, with a value of 31 nm. A small fraction of the particles is seen at larger sizes but this is similar for the NRs dispersed in both the toluene and in the inks formulation. Complimentary results for the DLS measurements are presented in FIG. 5. The dispersion of NRs in the ink formulation was found to be stable with no changes in particles sizes for more than 45 days at ambient conditions.

Patterns of the fluorescent inks were printed by an Omnijet 100 inkjet printer. FIG. 1C shows a printed signage of fluorescent NRs inks in two colors, green (31 nm/4.2 nm) and red (25 nm/5.2 nm), printed on glass. The printed pattern was illuminated by blue light emitting diodes (LEDs at 455 nm). The emission is clearly observed. The same sign under ambient light does not emit and the glass appears nearly transparent.

It is further demonstrated that the NRs inks are suitable for inkjet printing on a variety of substrates including glass, teslin paper, polycarbonate and silicon, and that the ink formulations show dispersion and optical stability over time.

Optical Properties of Printed Nanorods Versus Printed Quantum Dots

Following the successful preparation of NRs ink formulations, and demonstrating successful printing which exhibit intense fluorescence from the printed patterns, the inventors next focused on characterizing the unique optical characteristics of the NRs inks, in comparison with QDs inks formulations. The QDs used for the comparative inks were prepared by the successive ion layer adsorption and reaction (SILAR) method. During this procedure, a layer by layer growth of the CdS shell is conduct by the alternating injection of Cadmium and Sulfur precursors to the CdSe cores (as described fully below).

In general, it was found that the NRs inks showed excellent stability of the fluorescence properties upon multilayer printing. We further studied the advantages of replacing the commonly reported QDs with the NRs inks. Energy transfer and self-absorption phenomena should be pronounced more strongly in QDs structures in comparison with NRs, due to differences in the overlap between the absorption and emission spectra. FIG. 2A shows the absorption and emission spectra of CdSe/CdS seeded NRs used as the pigment of the green light emitting NRs ink. As can be seen, the overlap between the emission and the absorption is insignificant, due to the relatively large volume of the CdS rod in comparison with the volume of the CdSe seed, which serves as the emission center of the NC. FIG. 2B shows also the absorption and emission of green light emitting CdSe/CdS QDs ink. For the QDs, the overlap between the emission and absorption spectra is significantly larger due to the relatively similar volume of the CdS shell and the CdSe core.

Further examined was the effect of the particle structure on the optical properties of the printed arrays by testing printed samples containing NRs and QDs at different quantities. In order to achieve an accurate comparison between the different NCs, the same surface chemistry and ink formulations were used for both structures, as described in the experimental section. Since the QDs were dispersed in the same ink formulation used for the printing of the NRs inks, the differences in the optical behavior between the NRs and QDs inks are caused solely by the differences in their architecture.

Figure 6:
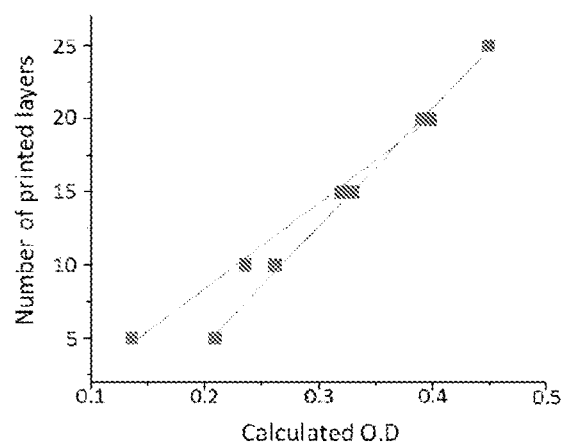
FIG. 6—Number of printed layers versus O.D of green emitting NRs ink and red emitting NRs ink. A linear correlation between the number of layers printed on the substrate and the extracted optical density is seen.

FIG. 2C shows the emission intensity at the peak wavelength, with excitation at 450 nm of NRs and QDs printed on glass at various optical densities (O.D). We have found that there is a linear correlation between the number of layers and the calculated optical density of the printed samples (FIG. 6). The best way to express this behavior is by using the optical densities data, at the excitation wavelength of 450 nm, for the comparisons presented herein. The emission of the printed QDs first show a slight increase of the intensity caused by increase in emitter concentration on the substrate obtained by printing increasing numbers of layers, which is then followed by saturation and then even a decrease in the emission intensity already at a relatively low optical density value of 0.14. In contrast, the intensity of the printed NRs increases linearly with the increased number of printed layers, without showing saturation nor quenching of intensity with thickness. This provides a direct method to achieve increasing fluorescence intensity from thicker rods layer, which is not possible while using QDs.

This clear advantage of the NRs inks is further emphasized in FIG. 2D which shows the measured external fluorescence QY of the same printed arrays of NRs (green) and QDs (blue). As the quantity of the printed material increases, the QY of the printed NRs remains remarkably stable, while the QY of the spherical dots decreases dramatically already at very low optical density values.

The differences in the optical behavior between the printed NRs inks and QDs inks are also notable by looking at the emission spectra of the printed arrays. FIG. 3A shows the emission spectra of printed NRs and QDs at various optical densities. The emission curves of the printed NRs with low O.D value and high O.D value remain similar upon the printing of more layers of ink, while a notable emission shift to longer wavelength is seen between the printed QDs with low thickness value to the high thickness value. FIG. 3A inset shows an image of the green emitting NRs ink at different O.Ds under UV light. FIG. 3B shows the emission wavelength shift of printed arrays of NRs and QDs measured at various values of optical densities. While the emission shift of the printed NRs is minor and within the error of the instrument, the printed QDs show a significant shift of the emission peak with the increase in ink layers that increase up to a value of 8 nm, even for this QD sample which has a very narrow emission band. The relatively small shift in the emission of the NRs enables the printing of multiple-layer arrays without the concern of change of the emission color. This is important for the application of inkjet printing for which multiple layers are needed for achieving high quality print. Similar optical behavior of stable emission wavelength and QY is seen also for the red emitting NRs inkjet printed layers (FIG. 7).

The inventors also observed that the significant decrease in the QYs and the shift in the emission wavelength for the printed QDs occur at a much lower optical densities than for the solution dispersions of the same type of particles (FIG. 8). This indicates that the close packing of particles in the printed arrays enhances the particle-particle interactions on the substrate compared to the liquid state, where there are large interparticle distances. For the NCs printed on substrate, dipole-dipole interactions also induce FRET interactions between the close distanced particles. Therefore, energy transfer occurs in addition to the self-absorption effect, which is the main effect for the liquid dispersions or for sparsely spaced QDs at high optical density. These mechanisms for the optical behavior are also supported by lifetime measurements for the printed patterns and for the liquid formulations. FIG. 3C shows the lifetime decay curves of printed NRs with optical density values of 0.14 and 0.41 in comparison with printed QDs at optical density values of 0.017, and 0.17. As clearly seen, the QDs show a significant shortening in the lifetime upon the addition of printed material, while the printed NRs exhibit negligible change in the lifetime decay in multi-layers. Furthermore, FIG. 3C inset shows the lifetime curves of QDs inks solutions at optical density values of 0.032 and 1.64. In contrast to the behavior of the printed arrays, the dispersions show an elongation of the lifetime upon the increase in the optical density. This kind of elongation of lifetimes is typical for a self-absorption phenomenon. These effects are quantified in FIG. 3D, which shows the effective lifetime taken at intensity value of 1/e for the printed NRs and QDs at various optical densities. The effective lifetime of the QDs shows a systematic decrease upon the addition of layers, by a factor of nearly 2 between the low O.D and the high O.D samples. In contrast, the lifetime of the NRs remains constant within the error value of the measurements. The reduction in the QD emission lifetime is attributed to the FRET interaction between the printed particles. However, due to the unique architecture of the seeded NRs, the inherent FRET interactions are significantly reduced and hence no energy transfer is seen.

Further established was the relevance of FRET interactions between the printed QDs by varying the percentage of dispersant molecules within the ink formulation. The addition of dispersants increases the distance between the QDs printed on the substrate and hence is expected to reduce the FRET, a process that is highly dependent on the donor-acceptor proximity on the 5-10 nm length scale. Ink formulation with 4.5% wt of dispersant was compared to the 1% wt dispersant in the original QDs inks. FIG. 4 shows the QYs values, emission intensities, and effective lifetimes (FIGS. 4A, 4B and 4C, respectively) of 4.5% dispersant QDs and 1% dispersant QDs, together with the results for printed NRs that are shown again for comparison. As clearly seen, upon increasing the amount of printed material, at high dispersant concentration the QY values are similar, an increase in the emission intensity is observed, and the lifetime decays remain similar for the samples containing higher percentage of dispersant. These optical features clearly imply that FRET interactions are more pronounced between the printed QDs in the original ink formulation containing 1% wt of dispersant molecules. These experimental results are also supported in the literature, for which the emission properties of printed QDs were improved by the addition of polymers.

The cartoon presented in FIG. 4D demonstrates the NCs arrangement within the printed arrays of NRs, QDs with 1% wt dispersant, and QDs with 4.5% wt dispersant (top to bottom respectively). For both NRs and for QDs with a higher percentage of dispersant, lower FRET interactions occur between the printed NCs, due to the relatively larger distance between the emission centers of the NCs. Clearly though, while the QDs inks require a special treatment such as the addition of further dispersant or polymer in order to achieve an improvement in their photoluminescence performance, the properties of the unique NRs inks remain constant in multi-layer inkjet printing without further chemical manipulations.

Experimental Details

Materials: trioctylphosphine oxide (TOPO), trioctylphosphine (TOP), octadecylphosphonic acid (ODPA), hexylphosphonic acid (HPA), Cadmium Oxide, Selenium powder 99%, Sulfur powder 99%, octadecylamine (ODA), octadecene (ODE), di propylene glycol monomethyl ether acetate (DPMA), and monomethyl ether acetate (PMA), were purchased from sigma Aldrich. The surface active materials Surfoamine L-100, was received from Huntsman, Netherlands.

The synthesis of seeded NRs was performed as follows: (All procedures carried out using inert atmosphere in Schlenk line).

The CdSe cores were synthesized based on reported procedures with modifications.[23] In a typical procedure for synthesis of CdSe cores, a reaction flask containing Cadmium Oxide (0.018 g), TOPO (3 g), ODPA (0.56 g), and TOP (1.8 mL) was placed under vacuum at 100° C. for half an hour. The solution was then heated to 350° C. under Argon, followed by the fast injection of Selenium powder (0.014 g) in TOP solution (720 μL). At this point, the color of the solution changes from colorless to yellow, which indicates the formation of CdSe QDs. The size of the nanocrystals is controlled by the CdSe time growth. For the green and yellow emitting NRs the diameter of the cores is between 2.2 nm to 2.4 nm, while for the red emitting NRs the diameter of the cores is between 3.0 nm to 3.4 nm.

CdSe/CdS seeded nanorods were synthesized as follows: In a typical NRs synthesis, a solution containing of previously prepared CdSe cores ($8 \times 10^{-6}$ mole) in TOP (1.8 mL) is premixed with sulfur powder (0.02 g). For the green emitting seeded NRs, cores with 2.2 nm diameter were used. For the red emitting seeded NRs CdSe cores of a diameter of 3.3 nm were used. For the seeded rods growth, The core solution was injected to a reaction flask containing Cadmium Oxide (0.08 g), TOPO (3 g), ODPA (0.29 g), and HPA (0.08 g) that was previously degased under vacuum at 100° C. for half an hour. The injection temperature was set to 360° C. under Argon. The synthesis lasted for 8 minutes, in which the growth of the CdS rod took place.

The CdSe/CdS core/shell QDs were synthesized by the successive ion layer adsorption and reaction (SILAR) method. In this core/shell quantum dots synthesis, a sequential layer by layer growth of Cadmium and Sulfur is applied on the CdSe cores. The quantities of the precursors needed for the growth of a CdS mono-layer were pre-calculated in advance and modified for different diameter of the CdSe cores. The Cadmium and Sulfur both in ODE were slowly injected to a solution containing CdSe cores ($1.5 \times 10^{-7}$ mole) in ODE (5 mL) and ODA (3 g). The temperature was then raised to 120° C. under vacuum, and stirred for half an hour. The injection of the Cadmium precursor for the first Cadmium layer was performed at 190° C. The first Sulfur portion was injected 30 minutes later under the same conditions. After each monolayer the temperature was raised by 10° C. degrees until the reaction temperature was set on 240° C. The time between each injection was set to half an hour, in which the layer growth and annealing is occurring.

Surface ligand exchange of the QDs from ODA to the alkyl-phosphonic acid and alkyl-phosphine ligands was conducted by adding TOPO (3 g), ODPA (0.56 g), and TOP (1.8 mL) to previously cleaned QDs dispersed in toluene solution (2 mL). The QDs were then mixed and refluxed in 100° C. for two hours.

The ink formulations were prepared as follow: The NCs were first cleaned and washed from excess of ligands and precursors by precipitation with methanol, followed by centrifugation and drying. Then, the NCs powder (0.04 g) was added to solvents mixture containing 90% DPMA and 10% PMA (2.92 g). Huntsman surfonamine (R) L-100 (0.04 g) was then added as the dispersing agent for the NCs. Bath sonication and horn sonication were applied for 30 min each along with stirring on vortex for a few minutes, in order to improve the dispersion of the NCs within the ink formulation.

The printing was carried out by using an Omnijet 100 (Unijet, Korea) printer equipped with Diamtix 30 picoliters piezoelectric printing head. The temperature of the substrate was set to 80° C. and the pattern was carried out in a 250 rows and columns with a 50 microns pacing between drops. Ink (1 mL) was loaded to the cartridge and used for printing experiments at 2500 Hz, with waveform characteristics of: 2 μsec rise and fall times, and 5 μsec at 40 volts For the optical analyses, square patterns (1 cm by 1 cm) were printed, composed of 250 rows and columns with 40 microns spaces between the lines.

The QY values obtained for both solutions and printed patterns were measured directly using the Hamamatsu absolute photoluminescence QY Spectrometer C11347 Quanturus—QY. The instrument measures the absorption and the emission of the sample within an integrated sphere and extracts its QY value. Correction of the QY by neglecting self-absorption in solutions is another feature of the instrument and is used for the determination of the most accurate QY of the solutions, without reabsorption effects. The QY values extracted by this method are absolute and therefore are more reliable than the data extracted by the commonly applied relative method, which uses an organic dye with a known QY as a reference. Both the nanoparticles solutions and the nanoparticles printed films are measured using this technique, using a special sample container.

Fluorescence lifetime measurements were carried out using a fluorescence spectrometer (Edinburgh Instruments FLS920) equipped with a film holder. The samples were excited at 405 nm, 0.2 MHz rate, using picosecond pulsed diode laser EPL-405. The fluorescence lifetimes were measured at 550 nm±5 nm using a high speed photomultiplier and time-correlated single photon counting.

DLS Analysis of CdSe/CdS Nanorods Inks

At a first stage, green and red emitting CdSe/CdS nanorods (NRs) ink solutions were prepared. In order to test the quality of the NRs dispersion within the ink formulations, dynamic light scattering (DLS) measurements were applied. FIG. 5 shows the DLS results of three runs (black, red, and blue) of green emitting NRs ink formulation. Each run contains 16 individual measurements in order to improve the accuracy of the results. The average size of the particles is 21 nm, which is similar to the average size of the particles dispersed in toluene measured in DLS (25 nm). This is also close to the dimensions of the NRs from TEM analysis (31 nm/4.2 nm).

Optical Properties of Printed Nanorods

The seeded NRs inks were successfully printed on a variety of substrates. As clearly noticed (data not shown), the fluorescent signage is highly emissive under LED light, while under ambient light no fluorescence is seen and the perspex appears nearly transparent.

Analysis of the optical behavior of green and red emitting NRs inks printed on glass at different number of layers was performed. The optical densities (O.D) of the different layers were extracted using the Hamamatsu absolute QY instrument. FIG. 6 shows the number of layers versus calculated O.D at the excitation wavelength of 450 nm for green emitting NRs (green) and red emitting NRs (red). As seen in the graph, there is a linear correlation between the number of layers and the optical densities extracted from the measurement.

FIGS. 7A-C show the emission intensity (A), quantum yield (B), and emission shift (C) of red emitting CdSe/CdS NRs (25 nm/5.2 nm) inks versus optical densities at the excitation wavelength of 450 nm. The emission intensity increases with the optical density, while the quantum yield and the emission shift do not show a significant modification with the addition of printed layers.

Optical Measurements for NRs and Qdots in Solutions

The optical properties of both NRs and quantum dots (QDs) solutions were examined at different optical densities at the excitation wavelength of 450 nm. FIG. 8A shows the quantum yield values of green emitting NRs and QDs in toluene solutions. As seen in the graph, as the optical density of the solution increases, the quantum yield of the QDs solution decreases dramatically, while the NRs solutions show only a slight decrease of the quantum yield. FIG. 8B shows the emission shift of the same solutions of QDs and NRs. The solutions containing QDs show a significant red shift upon the increase in the solution's concentration, while the solutions containing NRs show small emission shift at higher concentrations. These effects are caused by the self-absorption phenomenon, which is more pronounced for the QDs, due to the significant overlap of the absorption and the emission spectra in the QDs in comparison with the seeded NRs.

A 3D objected fabricated according to the present invention, employing the SLA method and comprising a plurality of seeded nanorods, as disclosed herein, is demonstrated in FIG. 9.

The invention claimed is:

1. A printed pattern composed of multiple material layers, each of said layers comprising a plurality of seeded nanorods, the seeded nanorods being selected to have substantially reduced overlap between the nanorods' absorption spectra and the nanorods' emission spectra, wherein the plurality of seeded nanorods are configured to exhibit in the pattern a reduced or diminished inter-particle interaction, wherein the printed pattern is selected from the group consisting of a film and a 3D object, and wherein the ratio of seed diameter to nanorod length is between 1:2.1 and 1:3, between 1:3 and 1:6, or between 1:6 and 1:10.

2. The printed pattern according to claim 1, the pattern being composed of multiple material layers, each of said layers comprising a plurality of nanorods, the nanorods being selected to have substantially reduced overlap between the nanorods' absorption spectra and the nanorods' emission spectra, and wherein the plurality of nanorods are configured to adapt in the pattern an inter-particle distance controllable to a reduced or diminished inter-particle interaction.

3. The printed pattern according to claim 1, wherein the seeded nanorods are selected amongst elongated nanoparticles embedding a seed element of a different material composition.

4. The printed pattern according to claim 3, wherein the seed element is selected from an elongated element, a spherical element, a core/shell element and a core/multishell element.

5. The printed pattern according to claim 4, wherein the seed is a non-core/shell structure selected from an elongated element and a spherical element, the element being of a material composition different than the material composition of the nanorod embedding the seed.

6. The printed pattern according to claim 5, wherein the seed is a core/shell or a core/multishell element, wherein the core and/or any one of the shells may independently have a spherical or an elongated shape.

7. A printed pattern composed of multiple material layers, each of said layers comprising a plurality of seeded nanorods, the seeded nanorods being selected to have substantially reduced overlap between the nanorods' absorption spectra and the nanorods' emission spectra, and wherein the plurality of seeded nanorods are configured to exhibit in the pattern a reduced or diminished inter-particle interaction, wherein the printed pattern is selected from a film and a 3D object, wherein the seed of said seeded nanorod has a size of less than 3 nm.

8. The printed pattern according to claim 1, wherein the nanorod material and the seed material is of a semiconducting material.

9. The printed pattern according to claim 1, wherein the nanorod material and/or the seed material comprising a semiconductor material.

10. The printed pattern according to claim 1, wherein the nanorod material and/or seed material is a semiconductor material selected from elements of Group I-VII, Group II-VI, Group III-V, Group IV-VI, Group and Group IV semiconductors and combinations thereof.

11. The printed pattern according to claim 10, wherein the material is or comprises an element of Group IV.

12. The printed pattern according to claim 1, wherein the seed material is different from the nanorod material.

13. The printed pattern according to claim 1, being in the form of a multilayered stacked arrangement.

14. A process for forming a pattern of a plurality of seeded nanorods, according to claim 1, the process comprising ink-jetting a formulation/dispersion of the seeded nanorods onto a surface region; wherein the nanorods are selected to have substantially reduced overlap between the nanorods' absorption spectra and the nanorods' emission spectra, the ink-jetting being configured to form a pattern of the nanorods, the pattern composed of a number of printed layers and exhibiting at least one of reduced or diminished re-absorption and reduced or diminished inter-particle interaction.

15. A device implementing at least one patterned film according to claim 1.

16. A printed pattern composed of multiple material layers, each of said layers comprising a plurality of seeded nanorods, the seeded nanorods being selected to have substantially reduced overlap between the nanorods' absorption spectra and the nanorods' emission spectra, and wherein the plurality of seeded nanorods are configured to exhibit in the pattern a reduced or diminished inter-particle interaction, wherein the printed pattern is selected from a film and a 3D object, wherein the seed of said seeded nanorods has a size of between 1 and 5 nm.

* * * * *

UNITED STATES PATENT AND TRADEMARK OFFICE
CERTIFICATE OF CORRECTION

PATENT NO. : 10,151,049 B2
APPLICATION NO. : 15/325483
DATED : December 11, 2018
INVENTOR(S) : Uri Banin et al.

Page 1 of 1

It is certified that error appears in the above-identified patent and that said Letters Patent is hereby corrected as shown below:

In the Claims

Column 22, Claim 10, Line 2:
Please delete "Group and Group IV"
And replace with -- Group III-VI, and Group IV --

Signed and Sealed this
Second Day of April, 2019

Andrei Iancu
*Director of the United States Patent and Trademark Office*